(12) United States Patent
Hsueh et al.

(10) Patent No.: US 9,213,799 B2
(45) Date of Patent: Dec. 15, 2015

(54) SYSTEMATIC DEFECT ANALYSIS METHOD AND MACHINE READABLE MEDIA

(71) Applicant: Realtek Semiconductor Corp., HsinChu (TW)

(72) Inventors: Pei-Ying Hsueh, Changhua County (TW); Chun-Yi Kuo, Taipei (TW); Chien-Mo Li, Taipei (TW); Po-Juei Chen, Taipei (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/459,307

(22) Filed: Aug. 13, 2014

(65) Prior Publication Data
US 2015/0205907 A1    Jul. 23, 2015

(30) Foreign Application Priority Data
Jan. 23, 2014    (TW) ............................. 103102535 A

(51) Int. Cl.
*G06F 17/50* (2006.01)

(52) U.S. Cl.
CPC .................................. *G06F 17/5081* (2013.01)

(58) Field of Classification Search
CPC ...................................................... G06F 17/50
USPC ......................................................... 716/112
See application file for complete search history.

(56) References Cited

U.S. PATENT DOCUMENTS

2007/0156379 A1*  7/2007  Kulkarni et al. ................. 703/14

\* cited by examiner

*Primary Examiner* — Thuan Do
(74) *Attorney, Agent, or Firm* — Winston Hsu; Scott Margo

(57) ABSTRACT

A systematic defect analyzing method, includes: partitioning physical sites into groups to obtain a plurality of groups of physical sites according to a plurality of physical features of a chip corresponding to different potential systematic defects; utilizing a processor to compute at least one defect probability of each group of physical sites; and deriving an analysis result according to the plurality of defect probabilities corresponding to the plurality of groups of physical sites.

3 Claims, 5 Drawing Sheets

| Categories | Potential Systematic/Random Defects | Physical Features (T.C) | | | Types of Values |
| --- | --- | --- | --- | --- | --- |
| | | Open | Bridging | Cell | |
| Location | Systematic defects in a certain layer of a certain location | O.LAY | S.LAY | C.LOC | Discrete |
| Planarization | Systematic defects caused by imperfect planarization | O.AMD | S.AMD | - | Continuous |
| Stress | Systematic defects induced by stress | O.CMD | - | - | Continuous |
| Spacing | Systematic defects related to spacing rules in the layout | O.NMD | - | - | Continuous |

FIG. 2

| Via | Groups | ES |
|---|---|---|
| $V_1$ | $G_1$ (layer 1) | $ES_1$ |
| $V_2$ | $G_2$ (layer 2) | $ES_1$ |
| $V_3$ | $G_3$ (layer 3) | - |
| $V_4$ | $G_1$ (layer 1) | $ES_2$ |

Defect Probabilities

|  | $ES_1$ | $ES_2$ |
|---|---|---|
| $G_1$ | 0.5 | 1 |
| $G_2$ | 0.5 | 0 |
| $G_3$ | 0 | 0 |

FIG. 3

SYSTEMATIC DEFECT ANALYSIS METHOD AND MACHINE READABLE MEDIA

BACKGROUND OF THE INVENTION

1. Field of the Invention

The disclosed embodiments of the present invention relate to a defect analysis method, and more particularly, to a systematic defect analysis method which is able to analyze defects with respect to given physical characteristics.

2. Description of the Prior Art

To fix yield problems in IC manufacturing, identifying root causes of systematic defects is critical. Physical failure analysis (PFA) is conducted on selected dies to understand defect mechanisms. Since PFA is a time-consuming and expensive process, the selection of dies should be carefully guided by systematic defect diagnosis. In recent studies, many dies have been discovered which have multiple defects; this issue therefore cannot be ignored in systematic defect diagnosis.

With suspected physical sites identified from several failing chips, many statistical analysis techniques have been proposed for systematic defect diagnosis, i.e. determining common root cause(s) of multiple defects among the failing chips. Statistical learning and layout-aware diagnosis have been proposed to estimate the failure rates of physical features. Statistical independence inference and causal inference have been used in systematic defect diagnosis to evaluate DFM rules. The chi-square test technique has been used to identify dominant open features, and the Z-test has been used to identify layers of systematic defects. Most of the above-mentioned techniques do not analyze a trend of defect occurrences associated with a given physical feature.

In light of the above, there is an urgent need for a novel systematic defect analysis method which can improve the issues of the prior art.

SUMMARY OF THE INVENTION

A systematic defect analysis method which is able to analyze defects with respect to given physical characteristics and an associated non-transitory machine readable medium are disclosed to improve the aforementioned issues.

According to an exemplary embodiment of the present invention, a systematic defect analyzing method is disclosed. The method comprises: partitioning physical sites into groups according to a plurality of physical features of a chip corresponding to different potential systematic defects; utilizing a processor to compute at least one defect probability of each group of physical sites; and deriving an analysis result according to the plurality of defect probabilities corresponding to the plurality of groups of physical sites.

According to another exemplary embodiment of the present invention, a non-transitory machine readable medium is disclosed. The non-transitory machine readable medium stores a program code, wherein when executed by a processor, the program code enables the processor to perform a systematic defect analysis method, and the method comprises: partitioning physical sites into groups to obtain a plurality of groups of physical sites according to a plurality of physical features of a chip corresponding to different potential systematic defects; utilizing a processor to compute at least one defect probability of each group of physical sites; and deriving an analysis result according to the plurality of defect probabilities corresponding to the plurality of groups of physical sites.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 shows seven physical features in four categories considered in this embodiment.

FIG. 3 shows an example of defect probabilities for a physical feature, O.LAY.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

Figure 1:
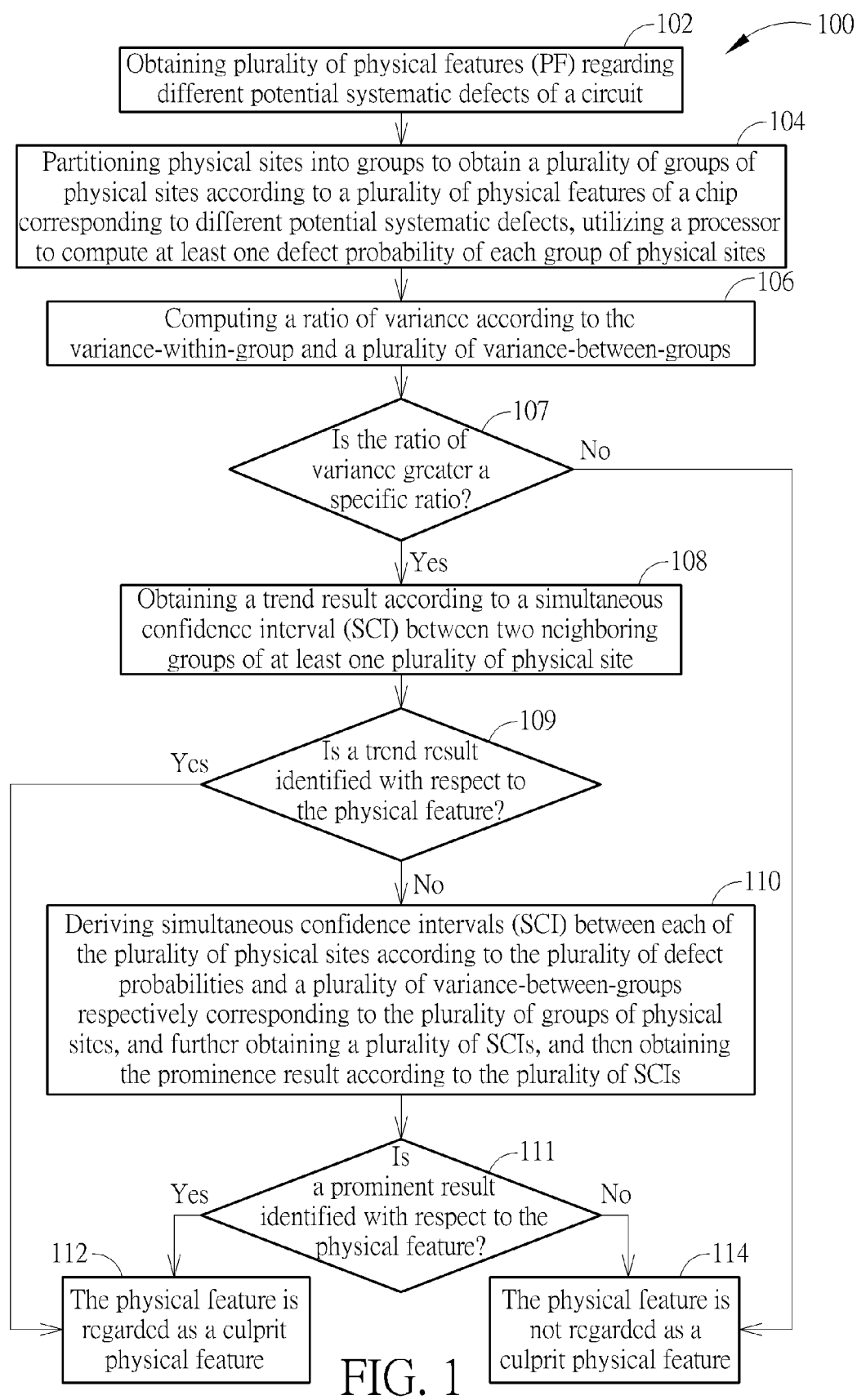
FIG. 1 is a flowchart illustrating a systematic defect analysis method according to an exemplary embodiment of the present invention.

FIG. 1 is a flowchart illustrating a systematic defect analysis method 100 according to an exemplary embodiment of the present invention. Provided that substantially the same result is achieved, the steps of the flowchart shown in FIG. 1 need not be in the exact order shown and need not be contiguous; that is, other steps can be intermediate. Some steps in FIG. 1 may be omitted according to various embodiments or requirements. The systematic defect analysis method 100 is briefly summarized as follows. In step S102, a plurality of physical features (PF) regarding different potential systematic defects of a circuit C (e.g. a portion of or all circuits of a chip) is obtained. FIG. 2 shows seven physical features in four categories considered in this embodiment. Physical features are denoted as 'T.C', where T indicates the related defect type, and C represents the characteristic in a category. For example, O.LAY is a physical feature related to open defects in a particular layer. Physical features in the 'Location' category are associated with systematic defects in a certain location or a particular layer. C.LOC is a physical feature associated with systematic intra-cell defects in a certain region of the layout. O.LAY and S.LAY are physical features associated with systematic open and bridging defects in a particular layer, respectively.

Physical features in the 'Planarization' category are associated with systematic defects induced by dishing and erosion in a chemical mechanical polishing (CMP) process. Severe erosion leads to large variations in dielectric thickness, which may cause bridging defects due to metal residue and reduction of critical dimension in the lithography process. For estimating dielectric thickness, accumulated metal density (AMD), which considers metal density in multiple layers underneath a certain region, is proposed. In this embodiment, O.AMD and S.AMD are physical features to diagnose systematic open and bridging defects due to imperfect planarization. A physical feature in the 'Stress' category is associated with stress-induced voiding (SIV), which occurs when high stress or damaged sites exist beneath a via which is connected to a wide metal. The occurrence of SIV in a via is associated with the connected metal density on the bottom layer of the via, as denoted by O.CMD. Since vias with high O.CMD are susceptible to SIV, this embodiment considers O.CMD as a physical feature. A physical feature in the 'Spacing' category is associated with insufficient via extension, which may cause metal line-end shortening defects [24]. The length of the shortening metal segment is restricted by the spacing rule, which in turn may not provide enough extension for the via. Therefore, this embodiment considers the metal density of neighbor segments in the layers connected by a via, denoted by O.NMD.

In step S104, physical sites of the circuit C are partitioned into m groups $G_1$-$G_m$ according to their values of a given physical feature. Physical sites are grouped in different ways between discrete and continuous physical features. As shown in the last column of FIG. 2, there are three discrete physical features: O.LAY, S.LAY and C.LOC. There are four continuous physical features, such as O.AMD and S.AMD. For a discrete physical feature PFD, physical sites are non-uniformly divided into several groups according to their values of PFD. For a continuous physical feature PFC, physical sites are first sorted in increasing order of PFC, and then uniformly divided into three groups. Further, according to the m groups of physical sites and n equivalence classes of suspected physical sites $ES_1$-$ES_n$ obtained through defect diagnosis, a defect probability $DP_{kj}$ of a physical sites group $G_k$ of the m physical sites of a site where the equivalence classes of a suspected physical site is located can be derived by using a computer, wherein the n equivalence classes of suspected physical sites are obtained by corresponding the n seed nets produced by the systematic defect analysis method to physical sites in the chip. $DP_{kj}$ is defined as:

$$DP_{kj} = \frac{|ES_{kj}|}{\sum_{k=1}^{m} |ES_{kj}|} \quad (1)$$

where $|ES_{kj}|$ is the number of suspected physical sites in $ES_j$ belonging to group $G_k$.

FIG. 3 shows an example of defect probabilities for a physical feature, O.LAY. Suppose that vias are partitioned into three groups, $G_1$, $G_2$ and $G_3$, according to their layers. For example, via $V_1$ and $V_4$ located in layer 1 are assigned to group $G_1$. Suppose that $ES_1$ has two suspected vias: $V_1$ and $V_2$. Since $V_1$ belongs to $G_1$ and $V_2$ belongs to $G_2$, $|ES_{11}|$ and $|ES_{21}|$ are both 1. According to equation (1), defect probabilities $DP_{11}$, $DP_{21}$ and $DP_{31}$ are 0.5, 0.5 and 0. $ES_2$ has only one suspected via $V_4$ belonging to $G_1$, so $DP_{12}$, $DP_{22}$ and $DP_{32}$ are 1, 0 and 0, respectively.

In step S106, the variance in defect probabilities among groups compared with those within each group is analyzed. Since the variances within each group (variance-within-group) could be caused by sampling errors, the summation of these variances is regarded as the variance due to errors, denoted by $VA_E$. $VA_E$ is calculated by equation (2), where $\overline{DP_{k*}}$ denotes the sample mean of defect probabilities in the $k^{th}$ group. The $DF_E$ denotes the degree of freedom for $VA_E$, wherein $DF_E = m(n-1)$.

$$VA_E = \frac{\sum_{k=1}^{m} \sum_{j=1}^{n} (DP_{kj} - \overline{DP_{k*}})^2}{DF_E} \quad (2)$$

Since the variance among groups (variance-between-groups) is highly correlated with the factor, it is regarded as the variance due to the factor, as denoted by $VA_F$.

$$VA_F = \frac{\sum_{k=1}^{m} n(\overline{DP_{k*}} - \overline{DP_{**}})^2}{DF_F} \quad (3)$$

where $DF_F = m - 1$.

Figure 4:
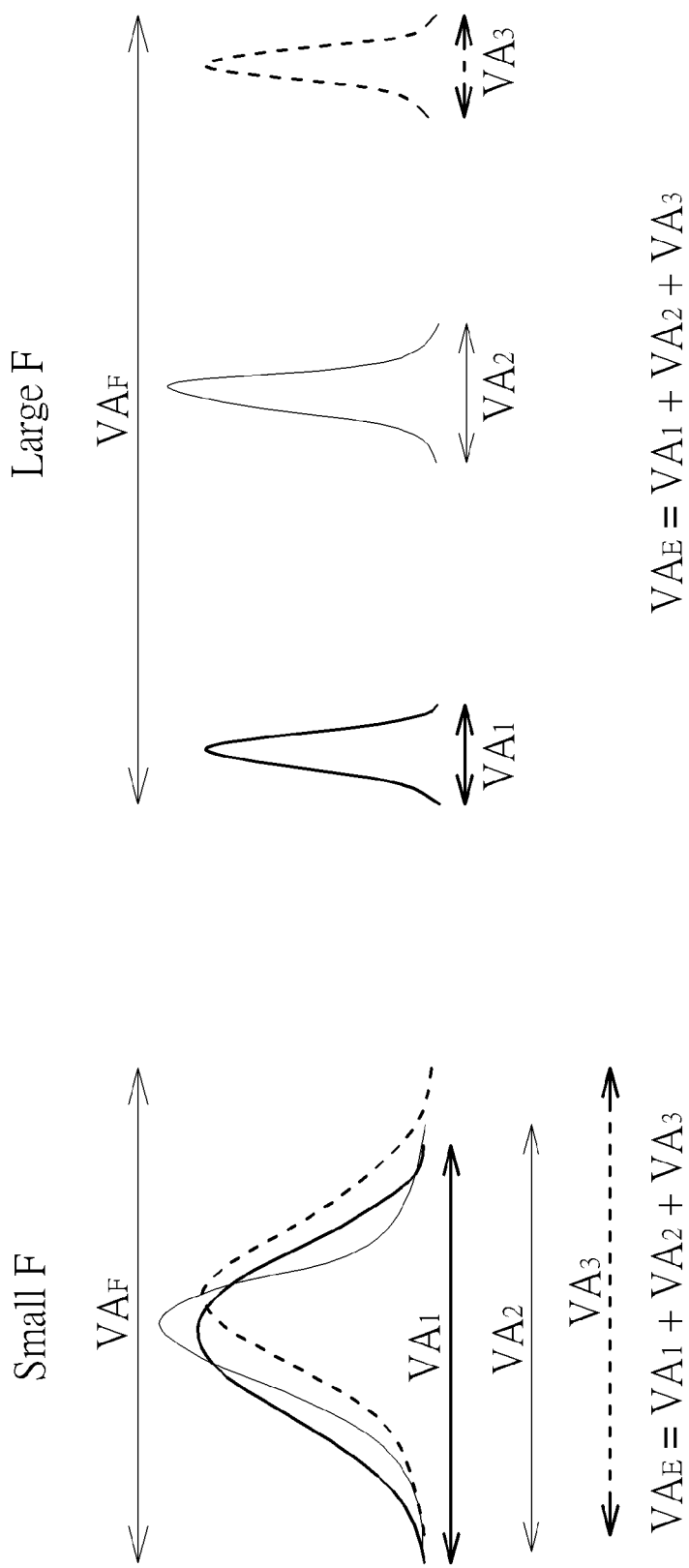
FIG. 4 shows an example of the ratio of variance between groups to variances within each group.

In this way, a ratio of variance=$VA_F/VA_E$ can be obtained. FIG. 4 shows an example of the ratio of variance. A high value of the ratio of variance indicates that the variance between groups of defect probability is significant (high variance-between-groups value) and the variance within a group of defect probability is not significant (low variance-within-group value); while a low value of the ratio of variance indicates that the variance between groups of defect probability is not significant (low variance-between-groups value) and the variance within a group of defect probability is significant (high variance-within-group value). In step S107, when the ratio of variance is greater than a specific threshold, the physical feature corresponding to the ratio of variance may be suspected as a culprit physical feature, and the flow will enter step S108 for further analysis; else, the flow will enter step S114, which means that the physical feature corresponding to the ratio of variance is not a culprit physical feature.

In step S108, for overall m groups, m−1 simultaneous confidence intervals (SCI) are calculated for each group pair. Given two groups, group a and group b, their respective population means of defect probabilities are denoted by $\mu_a$ and $\mu_b$. A SCI for $\mu_a$-$\mu_b$, denoted by SCI(a, b), is calculated for this group pair (a, b). Although $\mu_a$ and $\mu_b$ are unknown, SCI (a,b) can be estimated by sample means $\overline{DP_{a*}}$ and $\overline{DP_{b*}}$. Given a significance level $\alpha$, SCI(a, b) is calculated by equation (4):

$$SCI(a, b) = (\overline{DP_{a*}} - \overline{DP_{b*}}) \pm CV_\alpha \cdot S_{ab} \quad (4)$$

where $S_{ab}$ is the standard deviation of $\mu_a$-$\mu_b$, and $CV_\alpha$ is the critical value. Sab is estimated by equation (5) according to VAE and n.

$$S_{ab} = \sqrt{VA_E} \sqrt{\frac{1}{n} + \frac{1}{n}} \quad (5)$$

$CV_\alpha$ is obtained by equation (6) using Scheffe's method, which is a statistical technique to control family-wise significance level of overall m−1 SCI. In equation (6), Scheffe's method adjusts the square root of $F_\alpha$ by m−1 to make the SCI become more conservative.

$$CV_\alpha = \sqrt{(m-1) \cdot F_\alpha} \quad (6)$$

In this way, m−1 SCI between two neighboring physical sites of the plurality of physical sites $G_1$-$G_m$ can be derived. For instance, ($G_1$, $G_2$) or ($G_{m-1}$, $G_m$). If all SCI include only negative values, then an increasing trend is identified; and if all SCI include only positive values, then a decreasing trend is identified; otherwise, no significant trend is identified. If either an increasing or decreasing trend is identified, the given physical feature is suspected as a culprit physical feature. It should be noted that the trend-test is performed only for continuous physical features, such as O.AMD, and not for discrete physical features, such as O.LAY. In step S109, when a significant trend is identified with respect to the physical feature, step S112 will be entered, which means that the physical feature is regarded as a culprit physical feature; else, step S110 will be entered for further analysis.

In step S110, SCI is further utilized to calculate a prominence result. The prominence-test is performed to identify a prominent group whose defect probabilities are significantly larger than those of other groups. For a particular group $G_k$, overall m−1 confidence intervals are calculated for group pairs: $(G_k, G_1), (G_k, G_2) \ldots$ and $(G_k, G_m)$. If all confidence intervals include only positive values, then $G_k$ is a prominent group. If a prominent group is identified, the given physical feature is suspected as a culprit physical feature. In step S111, when a prominent result is identified with respect to the physical feature, step S112 will be entered, which means that the physical feature is regarded as a culprit physical feature; else, step S114 which means that the physical feature is not a culprit physical feature.

Figure 5:
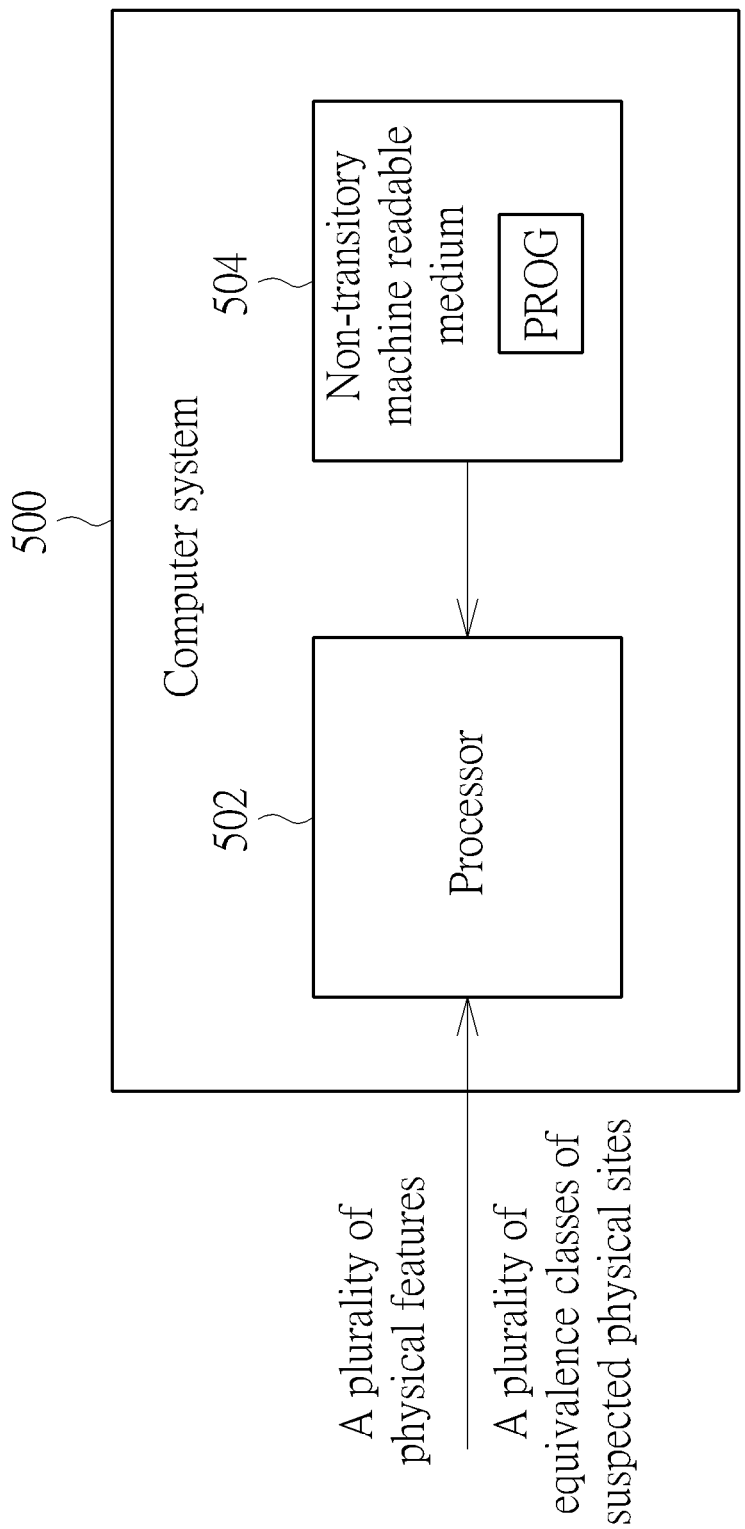
FIG. 5 is a diagram illustrating a computer system for performing the systematic defect analysis method according to an exemplary embodiment of the present invention.

Please refer to FIG. 5, which is a diagram illustrating a computer system 500 for performing the systematic defect analysis method according to an exemplary embodiment of the present invention. The computer system 500 includes a processor 502 and a non-transitory machine readable medium 504. For instance, the computer system 500 could be a personal computer, and the non-transitory machine readable medium 504 could be any storage device capable of storing data in a personal computer, e.g. a volatile memory, non-volatile memory, hard disk or CD-ROM. In this embodiment, the non-transitory machine readable medium 504 stores a program code PROG, wherein when the program code PROG is loaded and executed by the processor 502, the program code PROG enables the processor to perform the disclosed multiple defect diagnosis method (i.e. the steps S102-S114 shown in FIG. 1) of the present invention. Those skilled in the art will readily understand the systematic defect analyzing method performed by making the processor 502 execute the program code PROG after reading the above paragraphs; further description is therefore omitted here for brevity.

Compared with the conventional defect analysis method, the systematic defect analysis method disclosed herein can analyze the trend and reliability of defects with respect to a given physical feature, to effectively find out culprit defects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A systematic defect analyzing method, comprising:
utilizing a processor to perform following steps:
receiving a plurality of physical features and a plurality of equivalence classes of suspected physical sites of a portion or all of a chip;
partitioning physical sites into groups to obtain a plurality of groups of physical sites according to the plurality of physical features of a chip corresponding to different potential systematic defects;
computing at least one defect probability of each group of physical sites; and
deriving an analysis result according to the plurality of defect probabilities corresponding to the plurality of groups of physical sites, wherein the analysis result includes a trend result;
wherein the step of computing the defect probability of each of the groups of physical sites comprises:
according to the plurality of groups of physical sites and the plurality of equivalence classes of suspected physical sites obtained through defect diagnosis, computing a defect probability of each group of physical sites of a site where an equivalence class of a suspected physical site is located for each of the plurality of equivalence classes of suspected physical sites; and
the step of deriving the analysis result according to the plurality of defect probabilities corresponding to the plurality of groups of physical sites comprises:
computing a variance-within-group of each of the plurality of groups of physical sites according to the plurality of defect probabilities;
deriving a simultaneous confidence intervals (SCI) between two neighboring physical sites of the plurality of physical sites according to the plurality of defect probabilities and a plurality of variance-between-groups respectively corresponding to the plurality of groups of physical sites, and further obtaining a plurality of SCIs; and
obtaining the trend result according to the plurality of SCIs.

2. A systematic defect analyzing method, comprising:
utilizing a processor to perform following steps:
receiving a plurality of physical features and a plurality of equivalence classes of suspected physical sites of a portion or all of a chip;
partitioning physical sites into groups to obtain a plurality of groups of physical sites according to the plurality of physical features of a chip corresponding to different potential systematic defects;
computing at least one defect probability of each group of physical sites; and
deriving an analysis result according to the plurality of defect probabilities corresponding to the plurality of groups of physical sites, wherein the analysis result includes a trend result;
wherein the step of computing the defect probability of each of the groups of physical sites comprises:
according to the plurality of groups of physical sites and the plurality of equivalence classes of suspected physical sites obtained through defect diagnosis, computing a defect probability of each group of physical sites of a site where an equivalence class of a suspected physical site is located for each of the plurality of equivalence classes of suspected physical sites; and
the step of deriving the analysis result according to the plurality of defect probabilities corresponding to the plurality of groups of physical sites comprises:
computing a variance-within-group of each of the plurality of groups of physical sites according to the plurality of defect probabilities;
deriving simultaneous confidence intervals (SCI) between each of the plurality of physical sites according to the plurality of defect probabilities and a plurality of variance-between-groups respectively corresponding to the plurality of groups of physical sites, and further obtaining a plurality of SCIs; and
obtaining the prominence result according to the plurality of SCIs.

3. A non-transitory machine readable medium storing a program code, wherein when executed by a processor, the program code enables the processor to perform a systematic defect analysis method, the method comprising:

utilizing the processor to perform following steps:

receiving a plurality of physical features and a plurality of equivalence classes of suspected physical sites of a portion or all of a chip;

partitioning physical sites into groups to obtain a plurality of groups of physical sites according to the plurality of physical features of a chip corresponding to different potential systematic defects;

computing at least one defect probability of each group of physical sites; and deriving an analysis result according to the plurality of defect probabilities corresponding to the plurality of groups of physical sites, wherein the analysis result includes a trend result;

wherein the step of computing the defect probability of each of the groups of physical sites comprises:

according to the plurality of groups of physical sites and the plurality of equivalence classes of suspected physical sites obtained through defect diagnosis, computing a defect probability of each group of physical sites of a site where an equivalence class of a suspected physical site is located for each of the plurality of equivalence classes of suspected physical sites; and the step of deriving the analysis result according to the plurality of defect probabilities corresponding to the plurality of groups of physical sites comprises:

computing a variance-within-group of each of the plurality of groups of physical sites according to the plurality of defect probabilities;

deriving a simultaneous confidence intervals (SCI) between two neighboring physical sites of the plurality of physical sites according to the plurality of defect probabilities and a plurality of variance-between-groups respectively corresponding to the plurality of groups of physical sites, and further obtaining a plurality of SCIs; and obtaining the trend result according to the plurality of SCIs.

* * * * *